(12) United States Patent
Kano et al.

(10) Patent No.: US 8,518,543 B2
(45) Date of Patent: Aug. 27, 2013

(54) DLC-COATED SLIDING MEMBER AND METHOD FOR PRODUCING THE SAME

(75) Inventors: Makoto Kano, Ebina (JP); Takahiro Horiuchi, Ebina (JP); Shinichi Takagi, Ebina (JP); Masao Kumagai, Ebina (JP); Eiji Shimodaira, Sagamihara (JP); Yoshio Miyasaka, Nagoya (JP)

(73) Assignees: FujiWPC Co., Ltd., Kanagawa (JP); Fuji Kihan Co., Ltd., Aichi (JP)

( * ) Notice: Subject to any disclaimer, the term of this patent is extended or adjusted under 35 U.S.C. 154(b) by 271 days.

(21) Appl. No.: 12/866,196

(22) PCT Filed: Feb. 3, 2009

(86) PCT No.: PCT/JP2009/052124
§ 371 (c)(1),
(2), (4) Date: Nov. 8, 2010

(87) PCT Pub. No.: WO2009/099226
PCT Pub. Date: Aug. 13, 2009

(65) Prior Publication Data
US 2011/0044572 A1 Feb. 24, 2011

(30) Foreign Application Priority Data
Feb. 6, 2008 (JP) ................................ 2008-025910

(51) Int. Cl.
*B32B 9/00* (2006.01)
(52) U.S. Cl.
USPC .................. 428/408; 427/249.1; 427/249.7; 427/327; 427/328; 427/577; 428/336

(58) Field of Classification Search
USPC .................. 427/191, 249.1, 249.7, 327, 328, 427/404, 405, 577; 428/336, 404, 408
See application file for complete search history.

(56) References Cited

U.S. PATENT DOCUMENTS

| 5,391,422 | A  | * | 2/1995 | Omori et al. ................... 428/212 |
| 5,980,659 | A  | * | 11/1999 | Kawaura et al. .............. 148/535 |
| 6,279,913 | B1 | * | 8/2001 | Iwashita et al. ............... 277/442 |
| 6,553,957 | B1 | * | 4/2003 | Ishikawa et al. ........... 123/193.2 |
| 7,225,781 | B2 | * | 6/2007 | Tominaga et al. .......... 123/188.3 |
| 7,537,835 | B2 | * | 5/2009 | Mori et al. .................... 428/408 |
| 7,767,033 | B2 | * | 8/2010 | Fujiwara et al. .............. 148/217 |
| 2007/0292711 | A1 |  | 12/2007 | Ueno et al. |

FOREIGN PATENT DOCUMENTS

| JP | 05-086443 A | 4/1993 |
| JP | 05-179411 A | 7/1993 |
| JP | 11-077208 A | 3/1999 |
| JP | 2000-080992 | 3/2000 |
| JP | 2001-165200 | * 6/2001 |
| JP | 2001-280494 A | 10/2001 |

(Continued)

*Primary Examiner* — Archene Turner
(74) *Attorney, Agent, or Firm* — Sughrue Mion, PLLC (57) ABSTRACT

A sliding member is produced by forming hardening layers with two-layered structure on surface of a substrate metal with a Vickers hardness of not more than Hv300, such as aluminum or magnesium alloy for example, and then forming a DLC film having surface roughness defined as maximum height roughness Rz of 1 to 10 μm further on the hardening layers. The above-described hardening layers are composed of a first hardening layer dispersed with heavy metal particles, preferably made of tungsten and/or tantalum in the substrate metal, and a second hardening layer formed under the first hardening layer.

14 Claims, 11 Drawing Sheets
(4 of 11 Drawing Sheet(s) Filed in Color)

(56) References Cited

FOREIGN PATENT DOCUMENTS

| | | | |
|---|---|---|---|
| JP | 2004-084014 | * | 3/2004 |
| JP | 2005-146965 A | | 6/2005 |
| JP | 2006-138404 A | | 6/2006 |
| JP | 2006-194281 A | | 7/2006 |
| JP | 2007-291484 A | | 11/2007 |

* cited by examiner

DLC-COATED SLIDING MEMBER AND METHOD FOR PRODUCING THE SAME

CROSS REFERENCE TO RELATED APPLICATIONS

This application is a National Stage of International Application No. PCT/JP2009/052124, filed on Feb. 3, 2009, which claims priority from Japanese Patent Application No. 2008-025910, filed on Feb. 6, 2008, the contents of all of which are incorporated herein by reference in their entirety.

FIELD OF THE INVENTION

The present invention relates to a sliding member provided with diamond-like carbon (this term will hereinafter be abbreviated "DLC") film on the sliding face with other members, which is excellent in the adhesion with the metallic base and especially shows effects of decreasing friction at a sliding region under lubrication for a long period, and to a method for producing the sliding member of this kind.

BACKGROUND ART

Environmental problems on a global scale including warming temperature are being watched, concerning especially reduction of $CO_2$ elimination, which is considered to have a major effect on the warming trend across the globe, setting procedure of regulatory criterion of $CO_2$ has become the center of great interest.

In regard to $CO_2$ reduction, it is one of major challenges to improve fuel efficiency of motorcars, for example, and it is strongly hoped to improve performance of sliding material and lubricant.

It is an function of the sliding material to exhibit excellent wear resistance and low friction coefficient for a sliding region in a heavy frictional wearing environment, and application of various hard film materials such as DLC is forwarded, recently.

In a case of coating hard DLC on a soft substrate such as aluminum alloy or so, at a time of producing the sliding member applied with the hard film of this kind, it is known to form an intermediate layer made of various metals and carbides in thickness on the order of nano-meter on the substrate surface in order to improve adhesiveness between substrate metal and DLC.

For example, with regard to the aluminum substrate, a method is proposed to form a hard film, such as DLC, after forming nitrogenous chromium film on the aluminum alloy substrate finished to maximum surface roughness of 3 μm or less (refer to patent documents 1).

With respect to ferrous substrate, it is proposed to form the top lop layer mainly containing DLC on the substrate through the four-layer structured intermediate layer composed of first layer made of metallic layer of Cr and/or Al, second layer made by mixing metal of Cr and/or Al, and one or more metal selected from W, Ta, Mo and Nb third layer made of at least one or more metal selected from W, Ta, Mo and Nb, and fourth layer made of amorphous material containing carbon and at least one or more metal selected from W, Ta, Mo and Nb, toward the top layer from the surface of the substrate (refer to patent documents 2).

On the other side, as a coating technique for the hard film with the intent of reducing friction, it is proposed to reduce the friction and improve anti-seizability, wear resistance under lubrication by forming hard film such as DLC on a steel substrate formed with undulation and micro-dimples by means of, for example, shot peening and fine grain peening in combination (refer to patent documents 3).

In this way, it is desired to establish a technique for improving adhesion of DLC with the substrate, especially low hardness substrate made of aluminum alloy, magnesium alloy or so, in order to apply DLC having excellent friction characteristics to various members practically.

Furthermore, most of sliding members in various types of machine equipment, including automotive engines are used under lubrication by industrial lubricants, therefore a technique is strongly required for enabling remarkable reduction of the friction, especially under the presence of lubricant as a technique for contributing to improvement of the global environment.

Patent Documents 1: JP, 2007-100133, A
Patent Documents 2: JP, 2003-171758, A
Patent Documents 3: JP, 2001-280494, A In the method described in the aforementioned patent documents 1 and 2, adhesion strength of DLC film is improved by forming the intermediate layer, however it is not possible to obtain sufficient effects especially in a case of using soft substrate such as aluminum alloy by reason that the intermediate layer has a thickness as thin as a few μm. That is, the DLC film is apt to peel off or wear out easily according to deformation of the substrate under the frictional condition of high bearing pressure, and there is a problem in that the DLC film is not possible to be applied to the soft substrate.

On the other side, in the method described in the patent documents 3, the large undulation in excess of thickness of the film is formed by the shot peening or cutting work, accordingly drastic deterioration is caused in the adhesion and wear resistance in a case of coating the DLC film on the soft substrate such as aluminum alloy or so. Additionally, the DLC film is easy to peel off at the position formed on a sharply projecting part of the substrate, and there is also a problem in that it is scarcely possible to recognize the reduction effects of the friction even under lubrication as the result of disclosing underlying metal of the substrate.

DESCRIPTION OF THE INVENTION

The present invention is made in the view of the aforementioned problems in the conventional sliding members provided with the DLC film. It is an object to provide a DLC-coated sliding member excellent in the adhesion between substrate and DLC film and possible to exhibit the remarkable reduction effect of the friction under the presence of lubricant and a method for producing the sliding member of this kind.

As a result of repeating assiduous studies as to surface treatments, surface reforming, sorts and quality of the intermediate layer, surface shape of the DLC film and so on, for solving the aforementioned problems, the present inventor found that it is possible to solve the aforementioned problems by forming a hardening layer composed of heavy metal particles dispersed therein on the surface of the substrate, and further depositing DLC on the hardening layer of the substrate so as to have proper surface roughness, thereby completing the present invention.

Accordingly, the sliding member according to this invention is characterized in that a DLC film is formed on surface of a substrate metal having Vickers hardness of not more than Hv300 through hardening layers composed of a first hardening layer and a second hardening layer formed on the underside of the first hardening layer, the DLC film has surface roughness defined as maximum height Rz of 1 to 10 μm, and the first hardening layer contains heavy metal particles dispersed in the substrate metal.

Furthermore, a production method for the sliding member according to this invention is characterized by projecting the heavy metal particles on the substrate metal having the Vickers hardness of not more then Hv300 so as to disperse the heavy metal particles under the surface of the substrate metal, and subsequently forming the DLC film on the surface of the substrate metal having ruggedness formed by projecting the particles after softening the irregularity by polishing the surface of the substrate metal.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 2 (a) is a schematic view (a) illustrating the main point of ball on disc type frictional wearing test used for evaluating critical load in the Examples.

FIG. 2 (b) is a schematic view (b) illustrating the main point of ball on disc type frictional wearing test used for evaluating of frictional properties under lubrication in the Examples.

BEST MODE OF CARRYING OUT THE INVENTION

Explanation will be given in detail below as to the DLC-coated sliding member according to this invention together with a method of the same.

As described above, the DLC-coated sliding member according to the present invention is formed with DLC film on surface of the substrate metal having Vickers hardness of not more than Hv300 through double-structured hardening layers, which are composed of the first hardening layer structured by heavy metal particles dispersed in the substrate metal, and the second hardening layer not including heavy metal components and formed on the underside of the first hardening layer, and the DLC film has surface roughness denoted by maximum height Rz of 1 to 10 μm.

That is, the hardening layers composed of the first hardening layer having dispersion structure of heavy metal particles and the second hardening layer on the underside lie between the substrate metal and DLC film, thereby improving adhesion and wear resistance of the DLC film, furthermore a lubricant is held by moderate irregularity on surface of the DLC film, thereby enabling reduction of the friction under lubrication.

The DLC-coated sliding member of this kind is applicable to sliding portions of the various machine equipments, such as sliding regions of a piston, a cylinder liner, a bearing metal, a sprocket, a chain guide and so on, in a case of internal combustion engines for motor cars, for example.

The hardening layers functioning as a intermediate layer in the DLC-coated sliding member of this invention have two-layered structure composed of the first hardening layer dispersed with heavy metal particles in the substrate metal and the second hardening layer located on the underside of the first hardening layer without containing the aforementioned heavy metal, as described above.

Although the "heavy metal" is generally defined as a metal having a density of not more than 4 or 5, it is desirable to use particles of a metal with a density of not more than 10 such as molybdenum (Mo), and especially preferable to use metal particles of tungsten (W) and/or tantalum (Ta) among them in the present invention.

On the other side, DLC has amorphous structure mainly composed of carbon, and composed of diamond structure ($SP^3$ bond) and graphite bond ($SP^2$ bond) as bonding configuration between carbon elements.

Concretely, it is possible to exemplify a-C (amorphous carbon) only composed of carbon elements, a-C:H (hydrogenated amorphous carbon) containing hydrogen, and MeC partially containing metallic elements such as titanium (Ti), molybdenum (Mo) and the like, though there is not restriction as to DLC used in this invention.

Concerning surface roughness of the DLC film of the DLC-coated sliding member according to this invention, it should be 1~10 μm on the maximum height Rz. The reason is that friction coefficient increases when the maximum height roughness Rz exceeds 10 μm and holding capacity of the lubricant is deprived and it becomes impossible to sufficiently reduce the friction coefficient under the lubrication if the maximum height Rz does not run up to 1 μm.

As to the shape of noses in the cross-section of the DLC film, it is desirable that ends of the noses have radii of curvature in a range of 50~500 μm. That is, bearing pressure is apt to become higher partially and friction coefficient increases owing to local peeling of the DLC film when the radii of curvature of the ends of the noses are less than 50 μm, and the holding capacity of lubricant is inclined to deteriorate because depressions become difficult to be formed finely and uniformly on the surface of the DLC film if the aforementioned radii of curvature are larger than 500 μm. In addition, it is possible to measure such the radius of curvature of the end of the nose from sectional photograph taken by the scanning electron microscope of 400 to 500 magnification or so, for example.

According to the scanning electron microscope as mentioned above, it is also possible to observe the depressions on the surface of the DLC film. The total area ratio of the depressions on the DLC film is desirable to be 25~70%, further desirable to be 51~60% in view of ensuring the holding capacity of lubricant, similarly. In this case, the depression is defined as a dent of not larger than ⅔ of maximum height Rz of the surface roughness configuration curve, for convenience.

Furthermore, concerning the hardness of the DLC film of the DLC-coated sliding member of this invention, it is possible to measure according to a measurement method of nano-indentation by using the commercially available nano-indenter device (ultra-micro hardness meter), and the nano-indentation hardness is desirable to be not lower than 10 Gpa. In a case where the nano-indentation hardness of the DLC film is lower than this value, the DLC film may be short in strength and may become impossible to obtain sufficient wear resistance.

Additionally, the above-mentioned nano-indentation hardness is more desirable to be not lower than 20 Gpa.

In the DLC-coated sliding member according to this invention, thickness of the above-mentioned hardening layers are desirable to be in a range of 1~100 μm, further in a range of 5~50 μm. The DLC film becomes to easily peel off and wear out owing to deformation of the substrate metal even by low bearing pressure when the thickness of the hardening layers is less than 1 μm. It is necessary to strengthen projecting condition of metallic particles (projection by using larger particles at a high speed condition for a long time) so as to obtain the hardening layers thicker than 100 μm, and significant deterioration of the productivity is questioned.

As mentioned above, the hardening layers are formed of two layers consisting of the first hardening layer containing dispersed heavy metal particles and the second hardening layer. In this case, the thickness of the hardening layers means thickness of the region having hardness higher than 10% or more as compared with that of the parent metal in sectional distribution of the hardness, as exemplified in FIG. 1.

Although there is not particular restriction as to the substrate metal used in the DLC-coated sliding member of this invention, it is possible to fulfill the function effectively, to accomplish weight saving of the members and contribute to the improvement of fuel efficiency in a case of automotive parts when the substrate metal is made of aluminum alloy or magnesium alloy, which is comparatively soft and difficult to be directly formed with DLC. Further, load bearing property is improved by forming the hardening layers, the DLC film is possible to be prevented from peeling caused by deformation, thereby leading miniaturization and weight saving of the parts.

In the case of using aluminum ally as the substrate metal, it is desirable to use the alloy containing silicon less than 1 mass % in view of material quality. If the silicon content of the aluminum ally is more than 1 mass %, a silicon-contained precipitation hardening phase shows a tendency to produce cracks at the time of projecting the metallic particles.

At the time of producing the DLC-coated sliding member of this kind, the aforementioned hardening layers are possible to be formed by projecting the heavy metal particles, preferably metallic particles made of tungsten and/or tantalum as mentioned above so as to collide against the surface of the substrate metal with the Vickers hardness Hv of not more than 300. That is, by the projection of the heavy metal particles, the first hardening layer containing the heavy metal particles dispersed in the substrate metal is formed on the surface of the substrate metal, and the second hardening layer is formed on the underside of the first hardening layer by mechanically hardening the substrate metal (work hardening) according to the collision of the metallic particles.

In addition, it is possible to use particles made of only one kind of metal, mixed particles of dissimilar metals, and particles made of alloy as the heavy metal particles without hindrance.

In order to project the aforementioned metallic particles on the surface of substrate metal, it is possible to use a projector of an injection type, an impeller type and so on, for example. Although the projection speed of the heavy metal particles is controlled according to kinds of the substrate metal and the metallic particles, it is desirable to be a speed approximately of not lower than 50 m/s or so in a case of substrate of aluminum alloy or magnesium alloy. The projection speed of the metallic particles is preferable to be selected within a range of 50~300 m/s.

A reason for limiting the Vickers hardness of the substrate metal into 300 or below is that it becomes impossible to obtain finely dispersed state of the heavy metal particles under the surface of the substrate metal and impossible to improve the hardness and form the hardening layers on the surface of the substrate metal if the hardness of the substrate metal exceeds Hv300.

As mentioned above, the metals having the density of 10 or above, especially tungsten and/or tantalum particles, are suitably used as the heavy metal particles, but trouble occurs sometimes in that fine and uniform dispersion of the particles into the substrate metal and formation of alloy layer can not obtain in a case where grain size of heavy metal particles is too large. Therefore, it is desirable to use the heavy metal particles in the shape able to pass through a sieve of 53 μm mesh.

According to the projection of the heavy metal particles on the surface of the substrate metal, the heavy metal particles are dispersed in the substrate metal, thereby forming the first hardening layer, and ruggedness is formed by the collision of the metallic particles at the same time. Accordingly, it becomes necessary to polish sharp protrusions on the surface in advance of forming the DLC film in order to regulate the surface roughness of DLC to be formed on the surface.

The surface roughness of the DLC film formed on the substrate metal depends on the surface roughness of the substrate metal, therefore in order to make the surface roughness of the film in the range of 1~10 μm of the maximum height Rz, it is required to lighten the ruggedness by polishing the surface of the substrate metal (surface of the hardening layers) roughen by the projection of the heavy metal particles, thereby regulating the surface roughness into comparable degree. As a polishing method in this time, it is possible to apply lapping by using the polishing tape, a means for projecting soft media held with abrasive particles, and so on.

After regulating the surface of the hardening layers of the substrate metal in the desirable surface roughness by such the polishing, the DLC film is formed on the aforementioned surface. In this case, the DLC film is desirable to be form in a thickness of 0.5~2.0 μm or so.

There is not restriction especially in a forming method of the DLC film, and an ionized deposition method, a sputtering method, an ion plating method, a plasma CVD method, a plasma ion implantation method, a hollow cathode arc evaporation method, a vacuum arc evaporation method and the like can be applied, for example.

In the present invention, the hardening layers having the structure dispersed with the heavy metal particles in the substrate metal is formed by projecting and striking, for example, the heavy metal particles on the surface of the substrate metal, and the DLC film is formed though such the hardening layers, accordingly adhesion and wear resistance of the film are improved remarkably. Though it is not necessarily clear as of now about the mechanism of this invention in detail, it seems that microscopic alloying is caused in the first hardening layer of the aforementioned hardening layers and nanocrystallization of the substrate metal structure is caused in the second hardening layer on the underside of the first hardening layer by kinetic energy at the time of the projection of the heavy metal particles. In the periphery of the heavy metal particles, for example tungsten particles, solid solution areas in which W is dissolved into the substrate metal are formed, and this is considered to be one factor for improving the adhesion of the film (refer to FIGS. 10, 11 described later).

In addition, it is possible to apply this invention to the plain bearing, and sliding portions of the various parts, such as the air compressor, the piston for engine, the connecting rod for engine, the cylinder block for engine and so on.

Examples

The present invention will be explained more concretely on basis of examples below. Needless to say, this invention is not limited to these examples.

(1) Production of DLC-Coated Test Pieces

Aluminum alloy A2017 (Al—Cu—Mg), A4032 (Al—Si), A5052 (Al—Mg), that are defined by the JIS H 4000, and magnesium alloy AZ31 (Mg—Al—Zn) defined by ASTM (American Society for Testing and Material) B90M were selected as the substrate metal, and circular plate-shaped disc specimens of 3 mm in thickness and 33 mm in diameter were prepared.

After polishing the surface of the above-mentioned disc specimens, pure tungsten or tantalum particles passed through the sieves of 50 μm mesh or 10 μm mesh were struck on the polished surface of the disc specimens respectively by using the projector of impeller type, at the projecting speed of 50 m/s or above.

The projected surface of the specimens were polished by the mirror surfaced lap, thereby smoothening sharp protrusions formed by the collision of the metallic particles, and then, the DLC-coated test pieces were obtained by forming the DLC film of 1 μm in thickness on the polished surface under thermal regulation not higher than 200° C. by using the plasma CVD method.

On the other side, test pieces produced without projecting the heavy metal particles (comparative examples 1, 5, 6), test piece formed with the DLC film on the disc specimen though the intermediate layer made by sputtering tungsten (comparative example 2), test piece produced by omitting the polishing after projecting the metallic particles (comparative example 3), further test piece produced by alumina particles in place of the heavy metal particles (comparative example 4) were prepared in order to compare with the respective examples of this invention.

The respective characteristic value and performance of the respective DLC-coated test pieces produced through the aforementioned process were investigated according to the procedure described below. The results are shown in Table 1 collectively.

(2) Surface Roughness of DLC Film

The surface roughness of the DLC film formed on the respective test pieces was measured by using the surface roughness meter of stylus type in conformity to the JIS B 0601.

(3) Radius of Curvature of End of Nose of DLC Film

The radii of curvature of the ends of noses in the irregularity on the surface of the DLC film were measured by manipulating computer-graphically the sectional photograph of the vicinity of the DLC film surface of 400 or 500 magnification taken by the scanning electron microscope.

(4) Total Area Ratio of Depressions on Surface of DLC Film

Total area ratio of depressions (dents of not deeper than ⅔ of maximum height Rz of the surface roughness configuration curve) on the surface of the respective DLC film was calculated by manipulating computer-graphically the photograph of the surface of the DLC film of 400 magnification taken by the scanning electron microscope.

(5) Nano-Indentation Hardness of DLC Film

The nano-indentation hardness of the DLC film of the respective test pieces was measured by the commercially available nano-indenter device (ultra-micro hardness meter).

(6) Thickness of Hardening Layers

Figure 1:
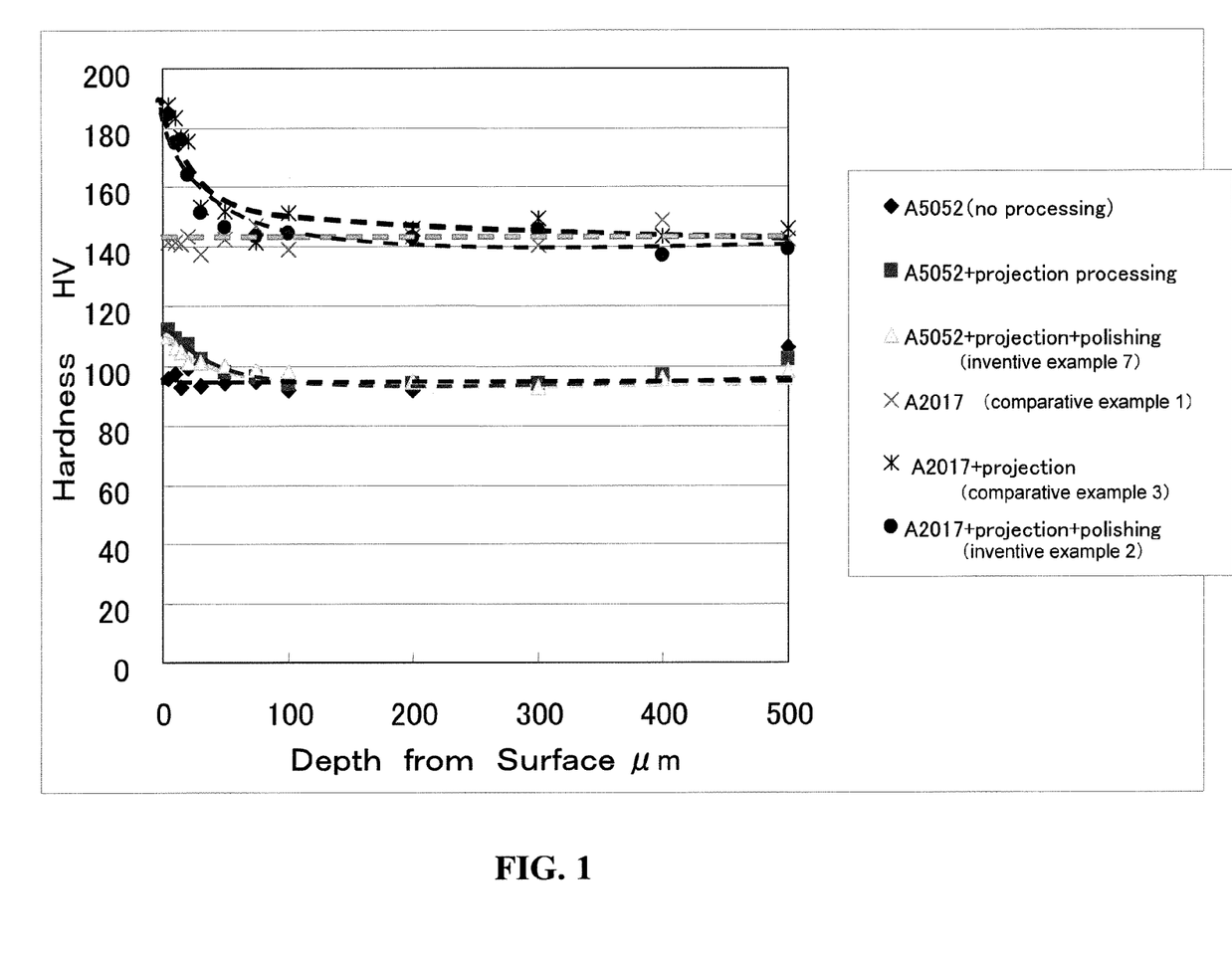
FIG. 1 is a graph showing an example of measurement results of hardness distribution of DLC-coated specimens produced in Examples in the through-thickness direction.

The hardness distribution in the through-thickness direction of the substrate metal of the respective DLC-coated test pieces was measured by using micro-Vickers hardness tester and holding at the load of 25 gf for 10 seconds. Subsequently, the thickness of the region hardened as much as 10% or more as compared with that of parent metal (unaffected zone of the substrate metal) was obtained from the hardness distribution, and the obtained value was determined as the thickness of the hardening layers. Examples of the measured hardness distributions (inventive examples 2, 7 and comparative examples 1, 3) are shown in FIG. 1.

(7) Critical Load

Figure 2:
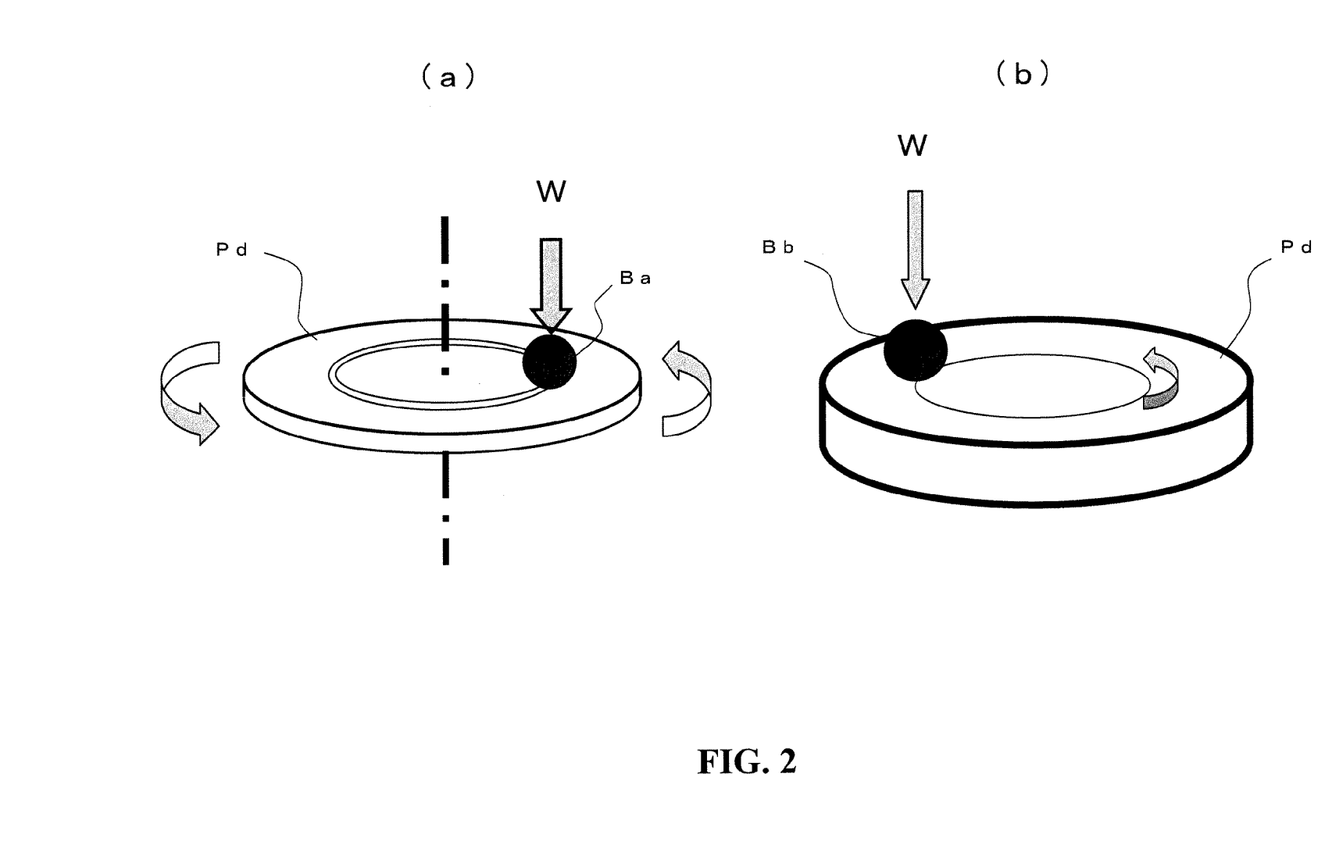

The ball on disc type frictional wearing test was carried out using the respective DLC-coated test pieces as shown in FIG. 2 (a). When the load applied to the ball was increased gradually in the aforementioned test, the load at the time of showing a rapid rise of the friction coefficient was obtained as the critical load of the respective test pieces.

That is, the disc-shaped DLC-coated test piece Pd manufactured as mentioned above was rotated in the direction of the arrow, and the ball Ba of 4 mm in diameter, which is made of alumina, having the surface polished in the roughness denoted by center line average height Ra of 0.02 μm, was pressed against the rotating test piece Pd in the vertical direction with the load W, thereby contacting them at the sliding speed of 0.05 m/s. In such the manner, the friction test was carried out for a maximum of 10 minutes in the air at room temperature by increasing the load W up to 100 N in a rate of 10 N per minute. In this time, AE (Acoustic Emission) was measured at the same time of measurement of the friction coefficient.

Figure 3:
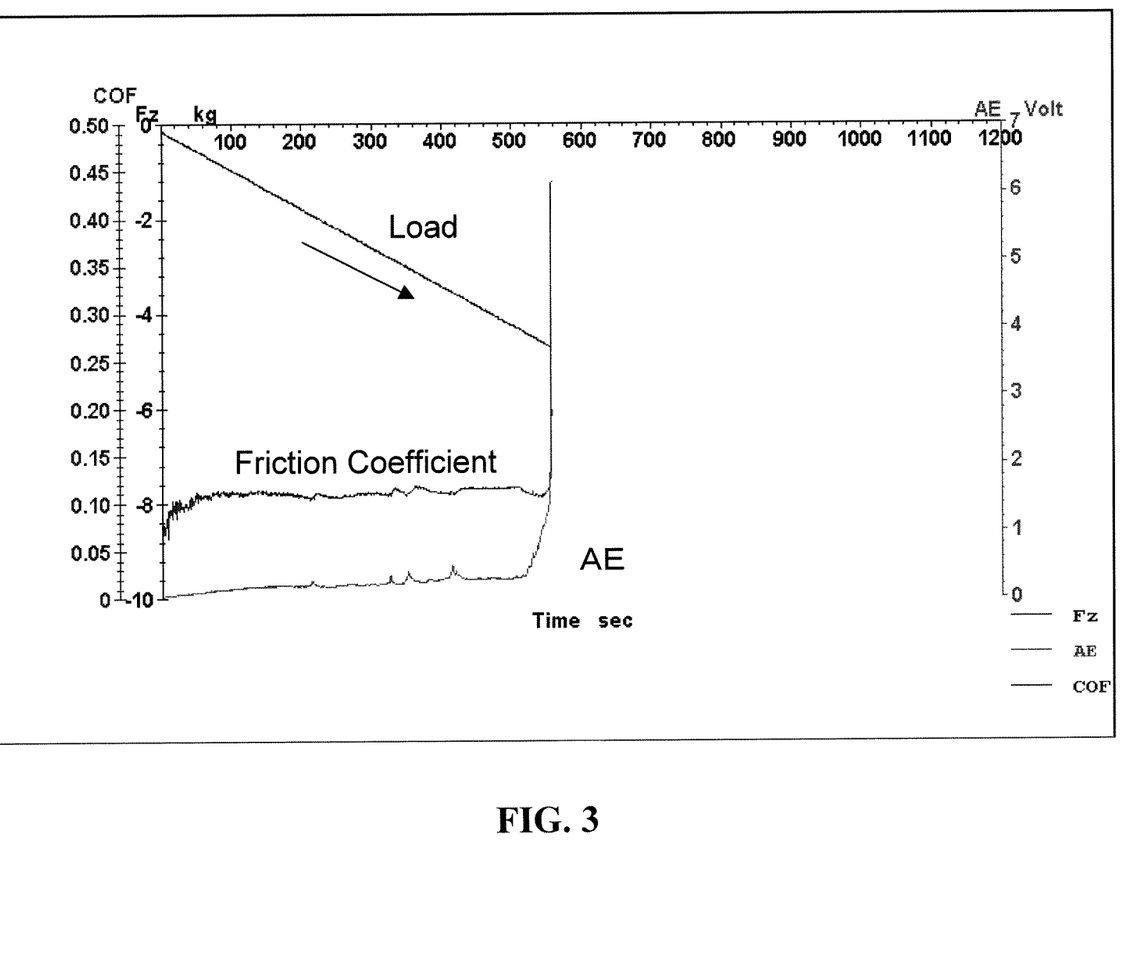
FIG. 3 is a graph showing measurement results of critical load obtained through the ball on disc type frictional wearing test of DLC-coated specimens obtained in comparative example 1.
Figure 4:
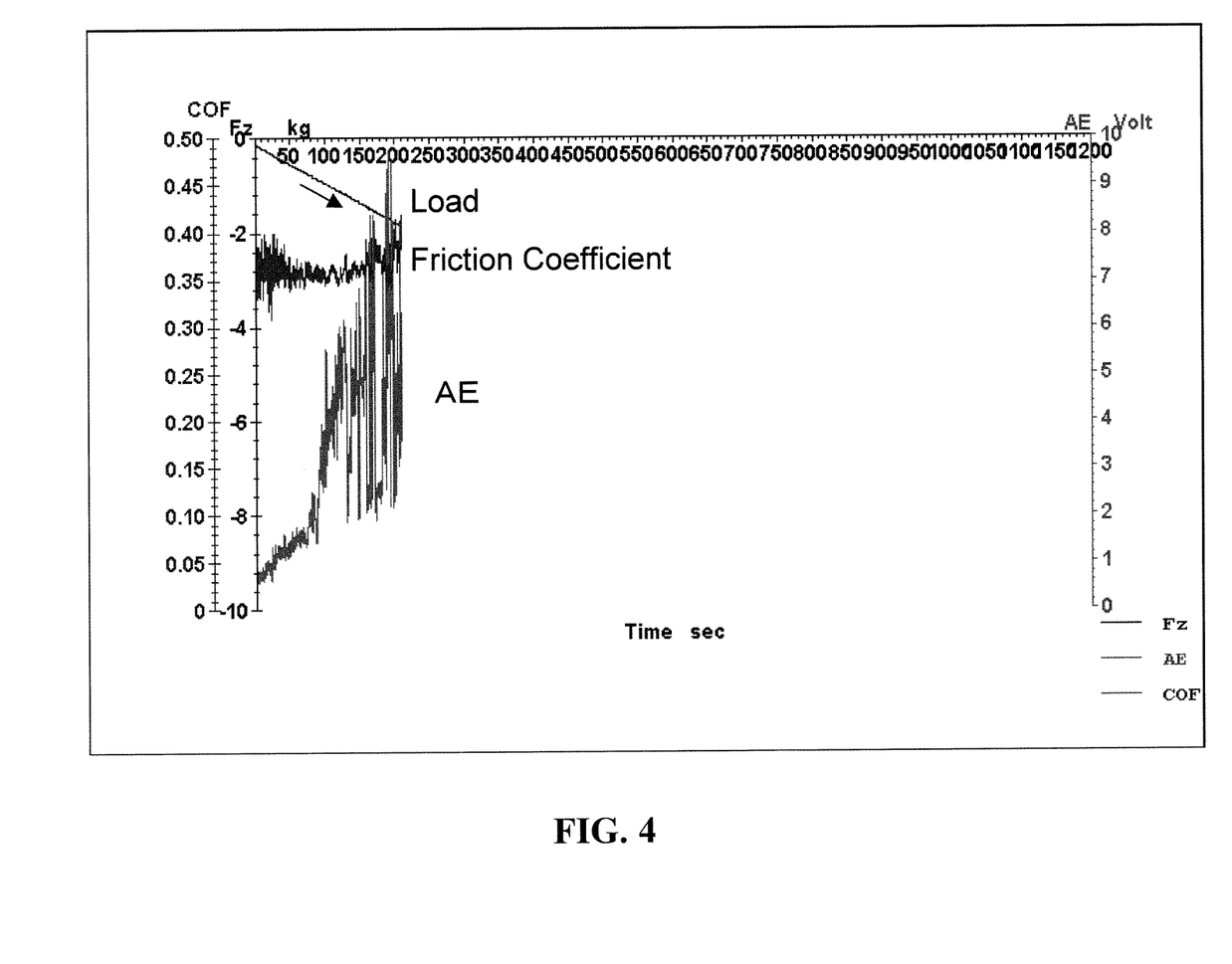
FIG. 4 is a graph showing measurement results of critical load obtained through the ball on disc type frictional wearing test of DLC-coated specimens obtained in comparative example 3.
Figure 5:
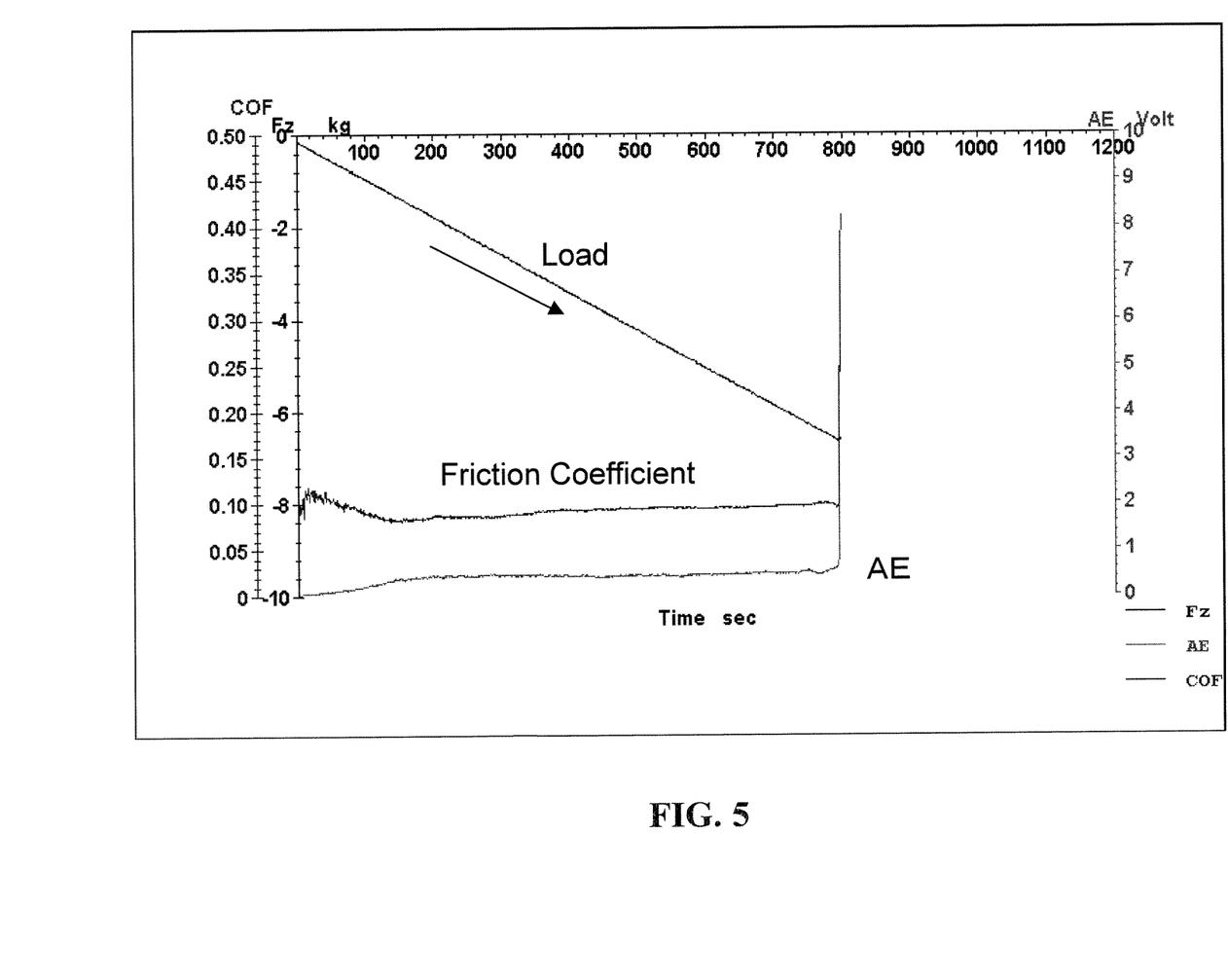
FIG. 5 is a graph showing measurement results of critical load obtained through the ball on disc type frictional wearing test of DLC-coated specimens obtained in inventive example 1.

FIGS. 3~5 shows measurement examples in cases of using the aluminum alloy A2017 as substrate metals. In these figures, the axis on left side indicates the friction coefficient and the axis on right corresponds to the generation magnitude of AE.

FIG. 3 shows the result of the comparative example 2, in which DLC was coated directly coating DLC on the substrate metal made of A2017 without forming the hardening layers, and it is clear that sudden increases of the friction coefficient and the AE, that is an elastic wave generated at the time of destruction, occurs at the same time at the load of about 5.5 kg (55 N). It seems that the DLC film has been peeled off and wear out in this time, thereby arising the contact with the substrate metal of aluminum.

On the other side, in the comparative example 3, in which DLC was coated after forming the hardening layers by projecting the tungsten particles without polishing the surface of the hardening layers, high friction coefficient in excess of 0.3 is observed from the beginning of the test and the generation of AE continuously increases from the earl stage of the test as shown in FIG. 4, and it seems that the DLC film has peeled off and wear out at the time of exceeding the load of 2.1 kg (21N) or so, thereby causing the contact with the substrate metal of aluminum.

As compared with the aforementioned comparative examples, in the inventive example 3, in which DLC was coated after forming the hardening layers by projecting the tungsten particles and polishing the surface of the hardening layers, it is clear that it is possible to remarkably improve the critical load up to 8 kg (80N) or so, as shown in FIG. 5.

out the projection processing using the tungsten particles without polishing, the DLC film of 1 µm or so in thickness was formed on the ruggedness formed by the projection on the substrate metal, therefore, there were many sharp protrusions on the surface of the film. As a result, the DLC film easily peeled off at the protrusions even at the load of low weight, and it was recognized a phenomenon that the friction coefficient increased rapidly at very low load.

Further, in the comparative example 4, in which alumina that is one of ceramic materials was used as particles for the projection processing, the load required for peeling the DLC film became higher slightly by forming the hardening layers with a thickness of some degree on the substrate metal, but it was not possible to improve the adhesion of the DLC film, remarkably.

As the main causes of the above, it is conceivable that the alumina particles are inferior in the consistency with the substrate metal because alloying does not occur even though the particles are partially embedded into the surface of the

TABLE 1

| Example No. | | Substrate Metal | Projection Processing of Heavy meta particles | | | | Characteristics and Performance of DLC film | | | | Thickness of Hardening Layers (µm) | Frictional Wearing Test | |
|---|---|---|---|---|---|---|---|---|---|---|---|---|---|
| | | | Kinds | Grain Size (mesh) | Projection Speed (m/s) | Polishing | Roughness Rz (µm) | Radius of Curvature (µm) | Area Ratio of Depression (%) | Hardness (Gpa) | | Critical Load (N) | Friction Coefficient |
| Inventive | 1 | A2017 | Pure W | ≦50 µm | ≧50 | Action | 7.9 | 65 | 57 | 18 | 80 | 81 | 0.16 |
| | 2 | A2017 | Pure W | ≦10 µm | ≧50 | Action | 8.9 | 50 | 32 | 17 | 30 | 75 | 0.11 |
| | 3 | A2017 | Pure W | ≦50 µm | ≧50 | Action | 7.2 | 70 | 58 | 18 | 70 | 80 | 0.15 |
| | 4 | A4032 | Pure W | ≦50 µm | ≧50 | Action | 8.1 | 60 | 60 | 18 | 60 | 82 | 0.16 |
| | 5 | A4032 | Pure Ta | ≦50 µm | ≧50 | Action | 6.5 | 90 | 48 | 17 | 40 | 72 | 0.12 |
| | 6 | A5052 | Pure W | ≦50 µm | ≧50 | Action | 8.7 | 55 | 55 | 18 | 70 | 85 | 0.15 |
| | 7 | A5052 | Pure W | ≦50 µm | ≧50 | Action | 8.1 | 60 | 57 | 18 | 50 | 81 | 0.15 |
| | 8 | A5052 | Pure W | ≦50 µm | ≧50 | Action | 8.7 | 55 | 56 | 18 | 60 | 82 | 0.16 |
| | 9 | A5052 | Pure Ta | ≦50 µm | ≧50 | Action | 6.3 | 95 | 45 | 18 | 40 | 74 | 0.12 |
| | 10 | AZ31 | Pure W | ≦50 µm | ≧50 | Action | 5.4 | 120 | 52 | 18 | 90 | 88 | 0.17 |
| | 11 | AZ31 | Pure W | ≦10 µm | ≧50 | Action | 5.1 | 105 | 28 | 18 | 50 | 79 | 0.09 |
| | 12 | AZ31 | Pure Ta | ≦50 µm | ≧50 | Action | 4.6 | 125 | 45 | 18 | 70 | 80 | 0.12 |
| | 13 | AZ31 | Pure Ta | ≦10 µm | ≧50 | Action | 4.4 | 135 | 25 | 17 | 40 | 75 | 0.09 |
| Comparative | 1 | A2017 | — | — | — | No | 0.15 | | | 15 | — | 55 | 0.31 |
| | 2 | A2017 | W layer | — | — | No | 0.14 | | | 15 | — | 58 | 0.22 |
| | 3 | A2017 | Pure W | ≦50 µm | ≧50 | No | 18.1 | 5 | 75 | 17 | 40 | 21 | 0.37 |
| | 4 | A5052 | Alumina | ≦50 µm | ≧50 | Action | 3.5 | 135 | 45 | 15 | 20 | 57 | 0.25 |
| | 5 | AZ31 | — | — | — | No | 0.13 | | | 15 | — | 48 | 0.32 |
| | 6 | A5052 | — | — | — | No | 0.15 | | | 15 | — | 45 | 0.31 |

As apparent from results shown in Table 1, in the comparative example 1, in which the DLC film was directly coated on the polished surface of the substrate metal of A2017 aluminum alloy without forming the hardening layers by the projection processing of the heavy metal particles, ascension of the friction coefficient occurred even at very low load, thereby resulting remarkable peeling of the DLC film.

In the comparative example 2, in which an intermediate layer of tungsten with a thickness of 0.005 µm was formed by argon sputtering on the substrate metal of aluminum in advance of the coating of DLC without projecting the heavy metal particles on the polished surface of the substrate metal of A2017 alloy, the lifetime of the film became longer up to respectable high load as compared with the comparative example 1 having no intermediate layer. However, abrupt ascension of the friction coefficient occurred immediately after generation of many cracks in the DLC film along with the deformation of the underlying metal of the DLC film at the time of exceeding the load of 20 N or so.

In the comparative example 3, in which DLC was coated on the substrate after forming the hardening layers by carrying substrate, and the interfacial adhesion becomes lower as a result of causing instability in plasma because the sufficient electric conductivity is not obtained at the time of coating DLC owing to the high insulation properties of alumina.

Also in the comparative example 5, in which DLC was coated directly on the surface of the substrate metal of AZ31 magnesium alloy without forming the hardening layers, it was cleared that ascension of the friction coefficient occurred at low load, and the DLC film peeled off.

In contrast, in the inventive examples 1~13, in which the hardening layers were formed by projecting the metallic particles made of tungsten or tantalum on the polished surface of the substrate metals of aluminum alloy or magnesium alloy and the DLC films with predetermined surface roughness were coated after polishing the projected surface of the substrate metals, it was confirmed to be excellent in the adhesion of the DLC films and to exhibit high durability.

(8) Sliding Friction Test Under Lubrication

Next, a sliding friction test was carried out under lubrication by using poly-alpha-olefin (PAO) as lubricating oil. The experimental results are shown together in Table 1.

That is, as shown in FIG. 2 (b), the friction test was carried out for 15 minutes by vertically pressing the steel ball Bb against the sliding surface of the DLC-coated test piece Pd obtained in each of inventive and comparative examples in a state of dropping aforementioned PAO of 0.1 mL on the sliding surface in advance, under frictional conditions of contact bearing pressure: 600 MPa, sliding speed: 0.05 m/s in the air of room temperature. The ball Bb is made of bearing steel SUJ2 (JIS G 4805), has a surface hardness of HRC62, a diameter of 9.6 mm, and polished in the surface roughness of 0.02 µm as the center line average height Ra.

As the results, in the comparative examples 1, 5 and 6, in which the DLC films were formed directly without forming the hardening layers on the substrate alloys, the DLC films peeled in the primary stages of the tests, thereby drastically increasing the friction coefficients also under such the conditions. Further, in the comparative example 2, in which the DLC film were coated through the intermediate layer of tungsten and the comparative example 4, in which projection processing were carried out by using the alumina particles, the friction coefficients were low in the early stages of the tests, however the friction coefficients increased gradually by causing partially peeling of the DLC films according as the lubricating oil was removed from the sliding surface, whereby the friction coefficients resulted in value exceeding 0.2 at the end of the tests.

Furthermore, in the test piece of the comparative example 3, which was obtained by coating directly the DLC film without polishing after projecting tungsten particles, the DLC film began to peel off from the protrusions of the ruggedness on the surface of the substrate in the primary stages of the tests, indicating the friction coefficient in excess of 0.2, and a phenomenon occurred in that the friction coefficient increased rapidly at the same time the underlying metal became to be remarkably disclosed during the course of the test.

As compared with these comparative examples, in the test pieces of the inventive examples 1~13, it became known that the DLC films were excellent in the adhesion and the wear resistance, the friction coefficients were possible to be maintained in low levels even at the high load, and effects were shown for remarkably reducing the friction in the sliding friction test under the lubrication.

After performing the critical load test as described in FIG. 2(a), the surface and the vertical section of wearing parts formed by sliding the alumina ball were observed, and the sectional roughness curves were measured as the abrasion loss (depth of wear) as to the test pieces obtained in the inventive example 7 and the comparative example 6 on behalf of the aforementioned examples.

Figure 6:
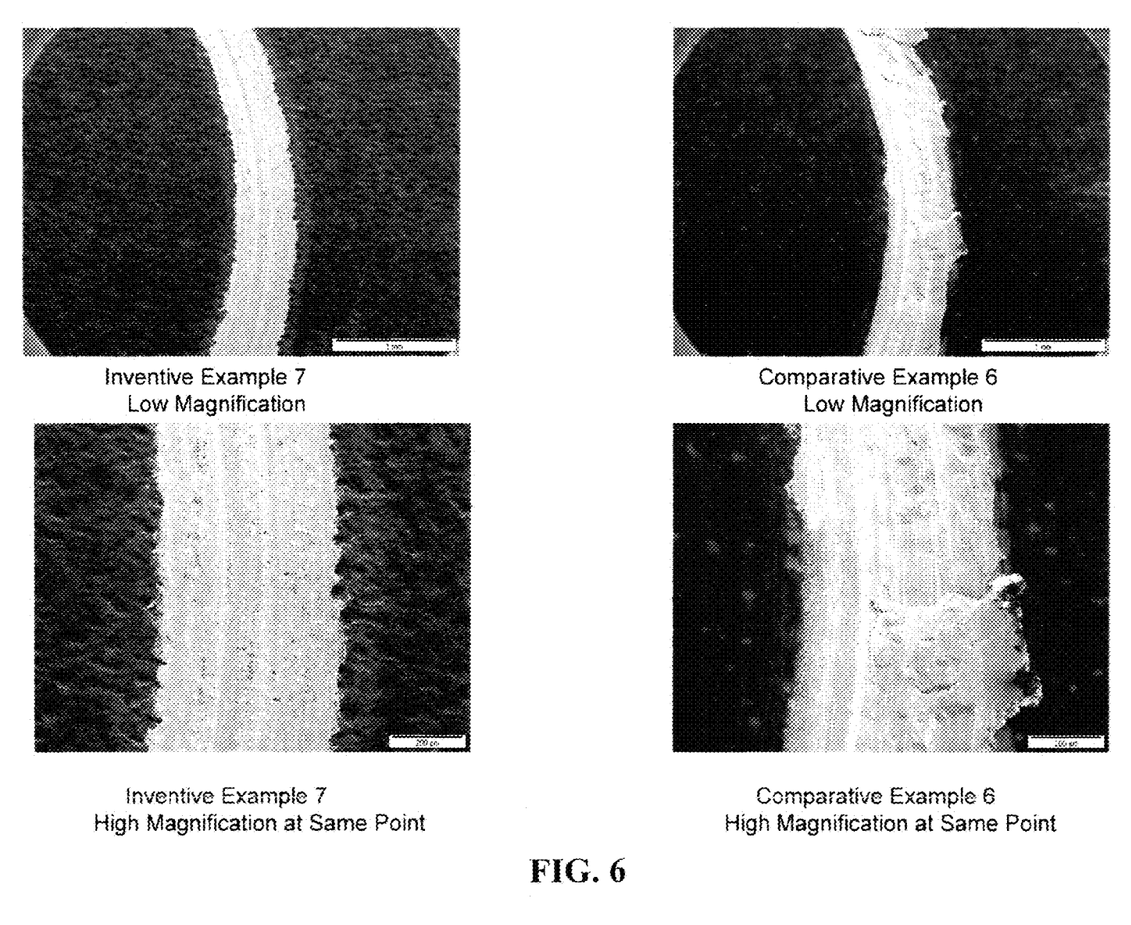
FIG. 6 are electron microscope photographs showing wearing surface conditions of the DLC-coated specimens obtained in inventive example 7 and comparative example 6 after the critical load inspection.

FIG. 6 shows photographs of the surface of the wearing parts by the electron microscope, there were agglutinated sites of abrasion powder of the disc material A5052 made by the alumina ball at the sliding portion on the disc-shaped test piece of the comparative example 6, it was cleared that a deep scuff was made in the sliding direction, consequently.

On the other side, concerning the sliding track on the test piece obtained by the inventive example 7, the agglutination of the abrasion powder of the disc material A5052 was not recognized entirely, and the deep scuff was not also observed on the smooth sliding surface, in addition to the above.

Figure 7:
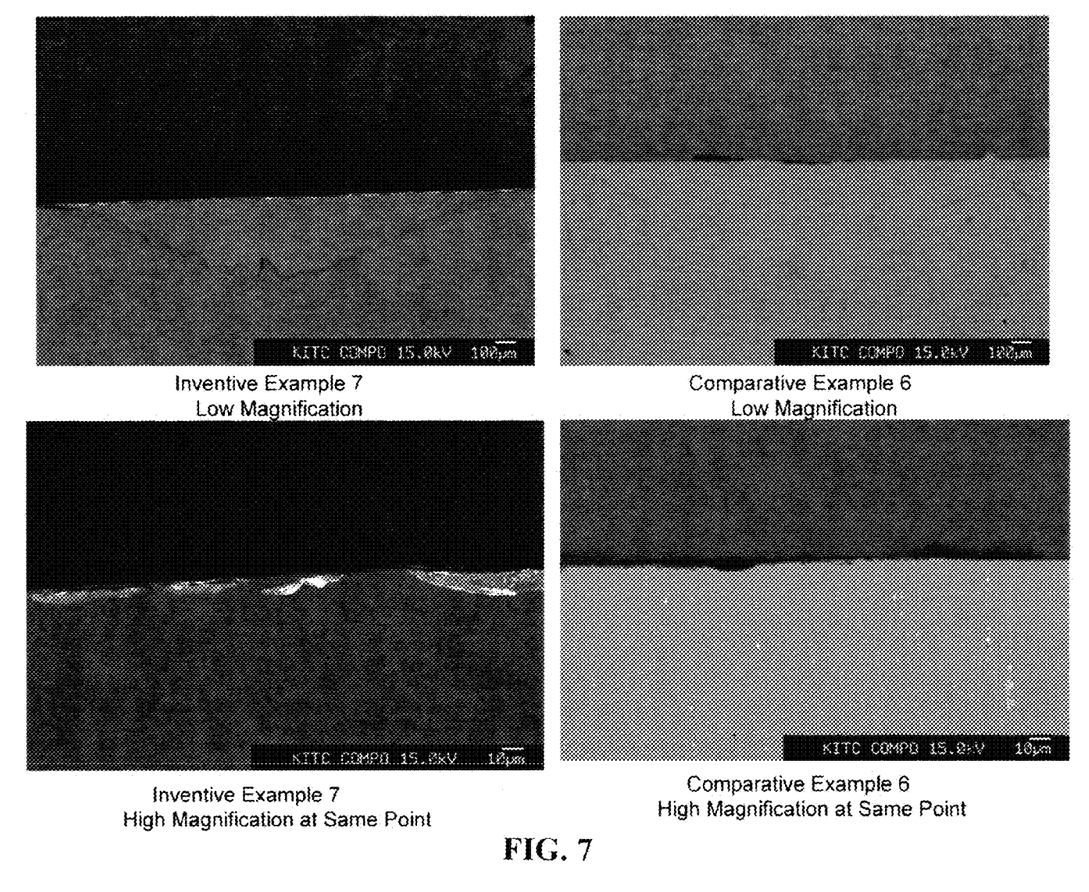
FIG. 7 are electron microscope photographs showing sectional conditions at wearing parts of the DLC-coated specimens obtained in inventive example 7 and comparative example 6 after the critical load inspection.

FIG. 7 shows the respective reflected electron composition images in a case of observing the vertical sections of the sliding regions of the aforementioned test pieces through argon ion etching. In the reflected electron composition images, a part with large mass is observed whitely, and a part with small mass is observed blackly. Accordingly, it was possible to observe that the surface reforming layer with tungsten remained in the vicinity of the sliding surface in the test piece of the inventive example 7 in spite of peeling the DLC film at the high load of 81 N by the alumina ball.

Very interestingly, it was cleared from the high magnification photograph of the test piece in the inventive example 7 that the dispersed particles of tungsten (massive white parts in the center of the photograph) were caused buckling on the depth direction from the sliding surface by plastic deformation generated with the load, the DLC layer followed and adhered to the surface of the particles, and mixed layer of the substrate aluminum alloy and the finely interrupted DLC film was layered on the buckling surface thereby repairing the concave.

On the contrary, in the comparative example 6, of which test piece was obtained without performing the surface deformation through the projection of metallic particles, the concave accompanied with formed together with the abrasion was clearly observed in spite of peeling the DLC film at the load of 45 N much lower than that of the inventive example.

Figure 8:
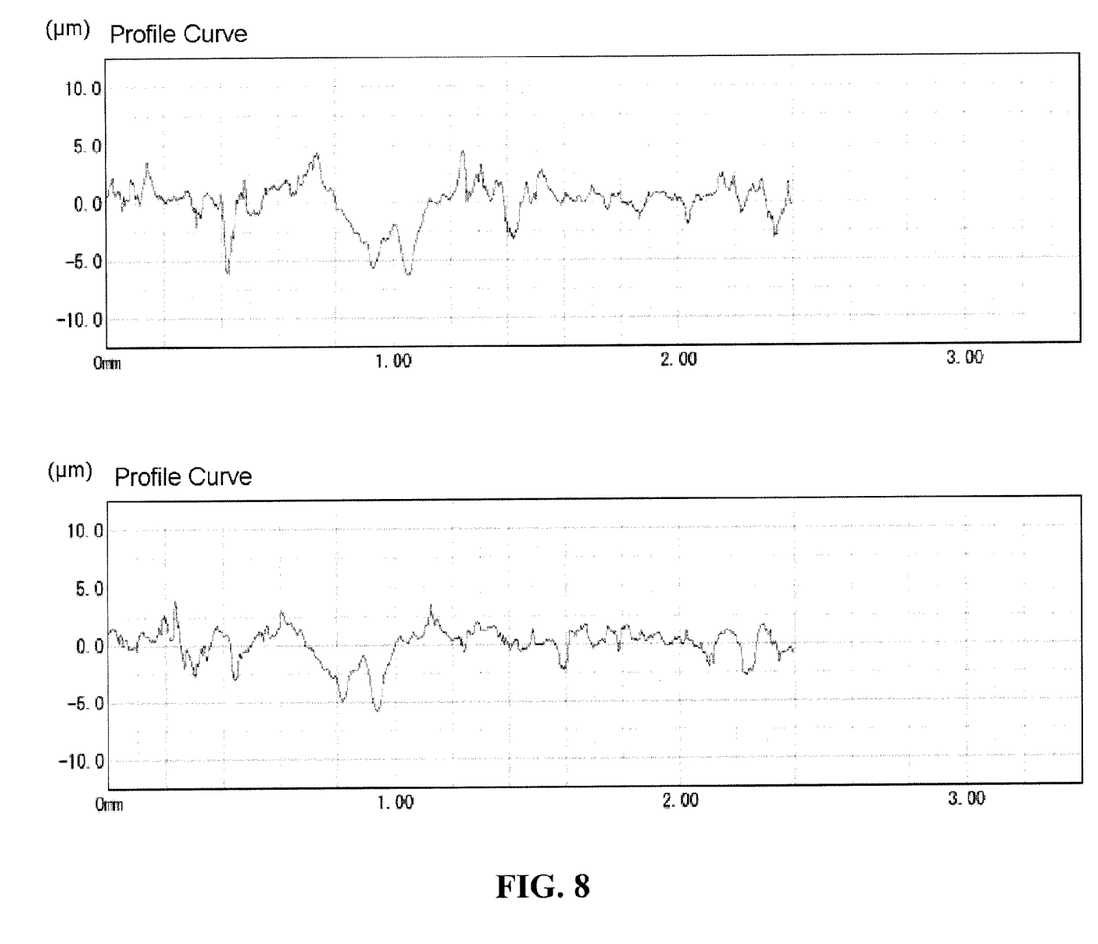
FIG. 8 are graphs showing measurement results of sectional roughness curves at wearing parts of the DLC-coated specimens obtained in inventive example 7 after the critical load inspection.
Figure 9:
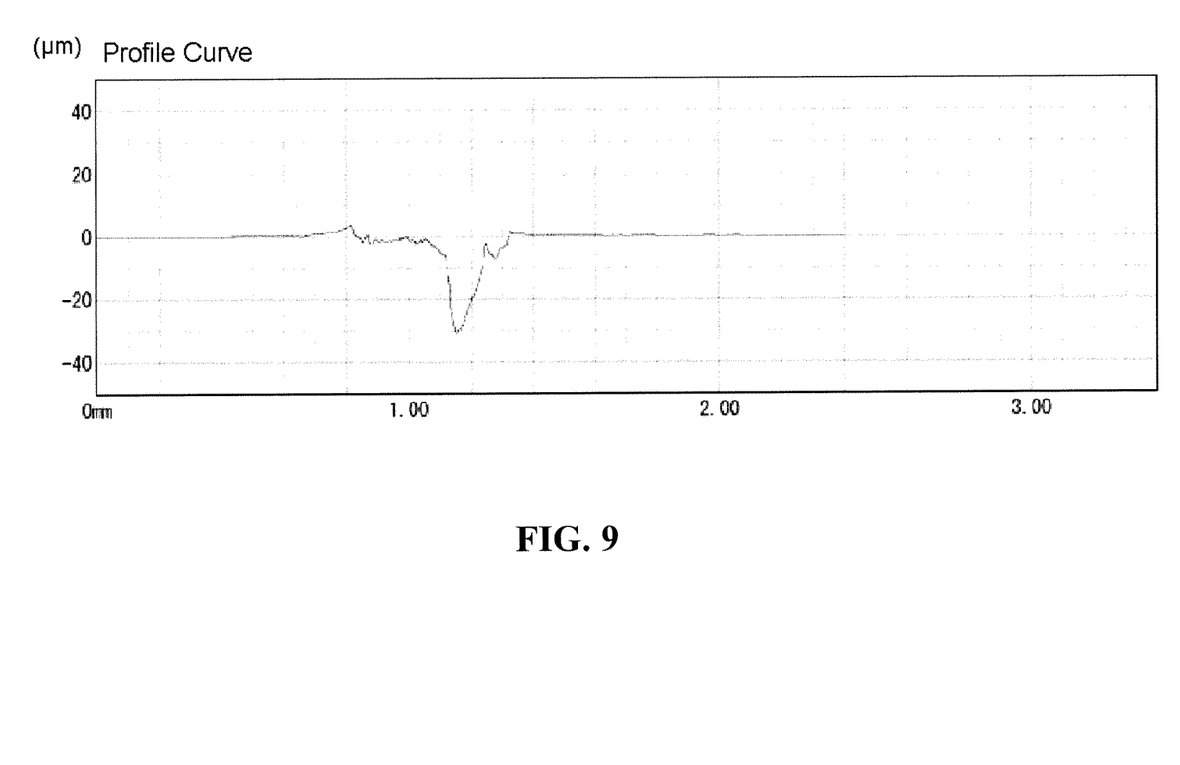
FIG. 9 is a graph showing measurement results of sectional roughness curve at wearing part of the DLC-coated specimen obtained in comparative example 6 after the critical load inspection.

FIGS. 8 and 9 show the measured results of the sectional roughness curves of the sliding surface of the aforementioned test pieces. In the inventive example 7, there was not clear difference between the initial surface roughness and the concave caused by the abrasion, and the formation of abrasion scuff was limited as much as 5 µm or so, even though the concave was caused by abration.

In contrast with above, a grooved wear track was recognized distinctly in a depth of about 30 µm in the comparative example 6.

Namely, it was confirmed in the examples of this invention that there was neither large concave nor agglutination of abrasion powder of the substrate aluminum alloy for all that the DLC film was compelled to peel by applying the high bearing pressure in a degree enough to deform the substrate metal at the same time of increasing the load on the sliding alumina ball. The aforementioned results indicate the improvement of the adhesion of the DLC film with the aluminum alloy and the reduction of the friction coefficient, and demonstrate that it is very effective to apply the sliding member of this invention to the aluminum alloy bearing for the automotive engine, and the sliding regions of the piston, the engine block, the air compressor and so on. Naturally, application of the present invention is not limited to these articles.

Also in the soft metallic substrate other than the aluminum alloy, it becomes unnecessary to disperse hard precipitates required for improving the wear resistance, therefore it becomes possible to apply the soft metals excellent in the workability to the sliding member by applying the present invention. Accordingly, the area of industrial application of this invention is very wide.

Figure 10:
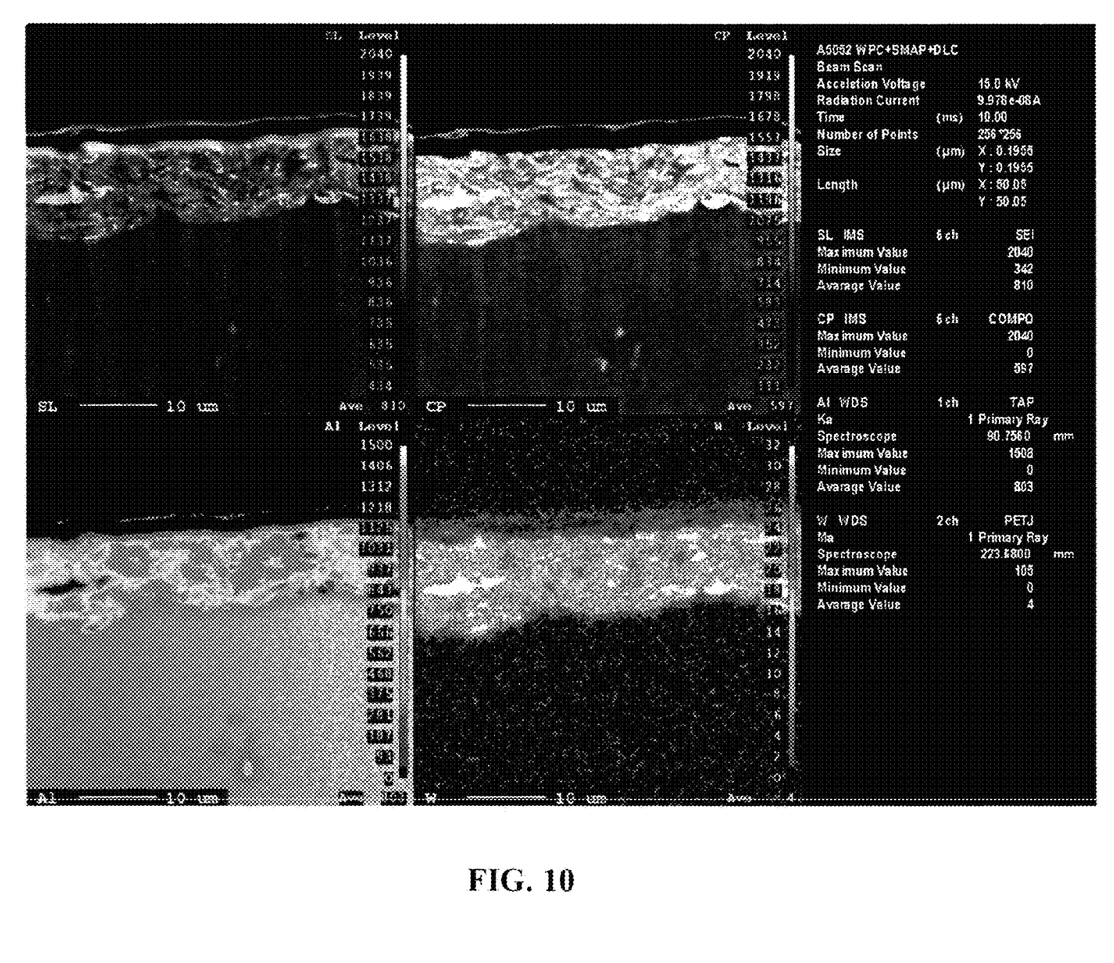
FIG. 10 is a picture image showing results of EPMA in the vicinity of hardening layers of the DLC-coated specimen obtained in inventive example 7.
Figure 11:
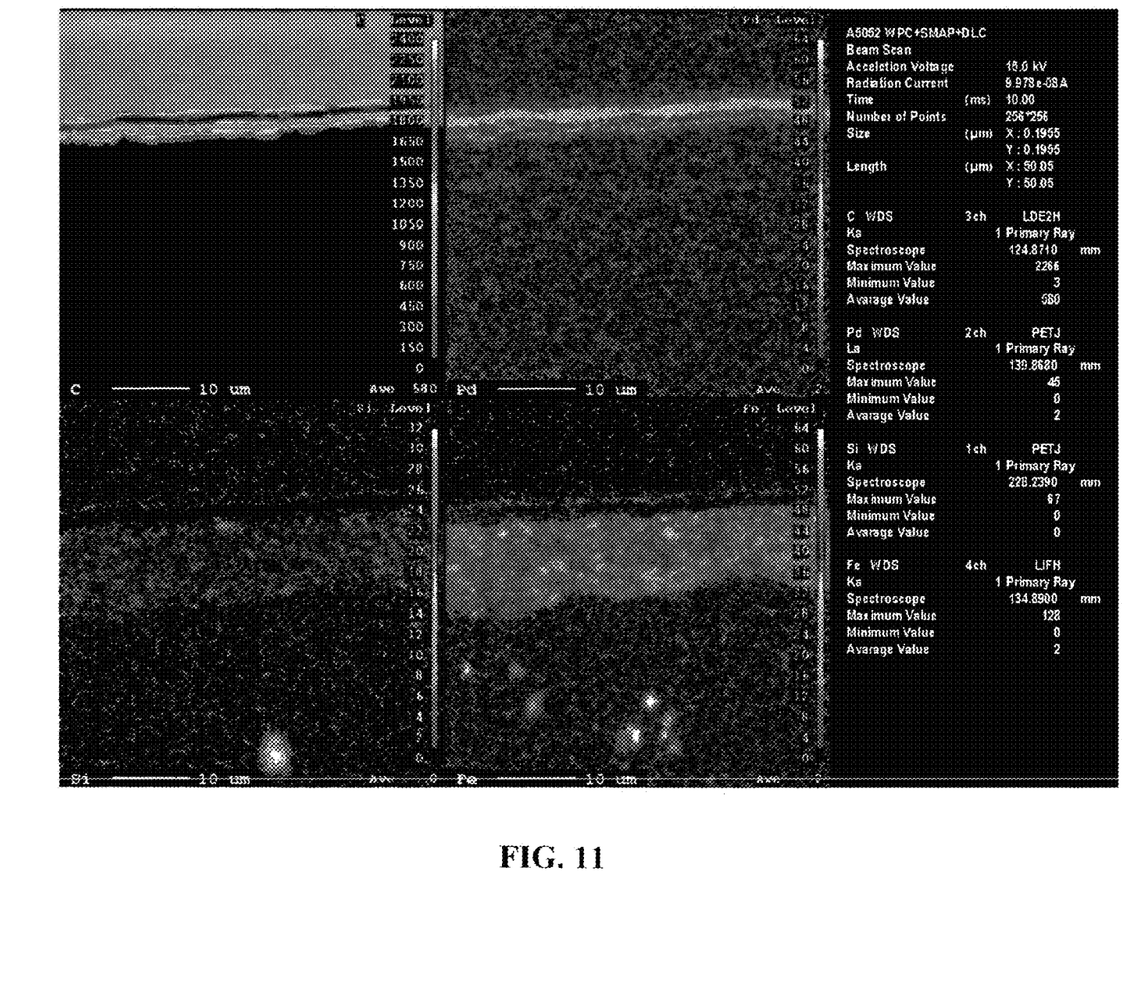
FIG. 11 is a picture image showing results of EPMA in the vicinity of hardening layers of the DLC-coated specimen obtained in inventive example 7.

FIGS. 10 and 11 show image information of EPMA in the vicinity of the hardening layers in the DLC-coated test piece obtained in the inventive example 7. As is known from yellow~green parts showing a distribution state of tungsten (W) in FIG. 10, the region where W is dissolved in the substrate metal is formed in the periphery of the massive tungsten particles identified as white parts, and this is one of main causes for improving the adhesion. Furthermore, it is known from a distribution state of carbon (C) shown in FIG. 11, that the coating layer of DLC is formed uniformly in a thickness of a little less than 1 µm (red zone) on the surface of the substrate metal.

INDUSTRIAL APPLICABILITY

According to the present invention, the DLC film of which surface has the maximum height hardness Rz of 1~10 µm is formed on the surface of the substrate metal with the Vickers hardness of 300 or less through the hardening layers provided with the first hardening layer dispersed with heavy metal particles in the substrate metal, and the DLC film, accordingly adhesion of the DLC film with the substrate metal is improved and it is possible to reduce the friction under existence of lubricant.

What is claimed is:

1. A sliding member formed with a DLC film on surface of a substrate metal made from aluminum alloy or magnesium alloy through hardening layers composed of a first hardening layer and a second hardening layer formed on the underside of said first hardening layer, wherein said DLC film has surface roughness of 1 to 10 μm on maximum height Rz, and said first hardening layer is composed of heavy metal particles dispersed in the substrate metal and said heavy metal particles consist of at least one of molybdenum, tungsten and tantalum.

2. The sliding member as set forth in claim 1, wherein said DLC film has irregularity with noses of which ends have radii of curvature of 50 to 500 μm in a section thereof.

3. The sliding member as set forth in claim 1, wherein said DLC film has depressions of 25 to 70% in total area ratio on surface thereof.

4. The sliding member as set forth in claim 1, wherein said DLC film has a nano-indentation hardness of not less than 10 Gpa.

5. The sliding member as set forth in claim 1, wherein said hardening layers have a thickness of 1 to 100 μm.

6. The sliding member as set forth in claim 1, wherein said substrate metal is aluminum alloy containing silicon of not more than 1% in mass ratio.

7. The sliding member as set forth in claim 1, wherein said heavy metal particles composing the first hardening layer consist of tungsten and/or tantalum.

8. The sliding member as set forth in claim 7, wherein said first hardening layer is formed with a region where tungsten and/or tantalum is dissolved in the substrate metal around the tungsten particles and/or tantalum particles therein.

9. The sliding member as set forth in claim 1, which is any one selected from the group consisting of a sliding bearing, an air compressor, a piston for engines, a connecting rod for engines and a cylinder block for engines.

10. A method for producing the sliding member as set forth in claim 1, which consists in dispersing the heavy metal particles consisting of at least one of molybdenum, tungsten and tantalum under the surface of the substrate metal by projecting said heavy metal particles on the substrate metal made from aluminum alloy or magnesium alloy, and subsequently forming the DLC film on the surface of the substrate metal having ruggedness formed by projecting said particles after softening said irregularity by polishing the surface of said substrate metal.

11. The method for producing the sliding member as set forth in claim 10, wherein said heavy metal particles are projected on the substrate metal by using a projector such as an air injection or, an impeller type or so.

12. The method for producing the sliding member as set forth in claim 10, wherein said heavy metal particles have a particle size passing through 53 μm mesh.

13. The method for producing the sliding member as set forth in claim 10, wherein said substrate metal is aluminum alloy containing silicon of not more than 1% in mass ratio.

14. The method for producing the sliding member as set forth in claim 10, wherein said heavy metal particles consist of tungsten and/or tantalum.

* * * * *